United States Patent
Sugahara et al.

(10) Patent No.: US 6,620,665 B1
(45) Date of Patent: Sep. 16, 2003

(54) METHOD FOR FABRICATING SEMICONDUCTOR DEVICE

(75) Inventors: Gaku Sugahara, Nara (JP); Tohru Saitoh, Osaka (JP); Minoru Kubo, Mie (JP); Teruhito Ohnishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/787,108

(22) PCT Filed: Sep. 13, 1999

(86) PCT No.: PCT/JP99/04962

§ 371 (c)(1),
(2), (4) Date: Mar. 14, 2001

(87) PCT Pub. No.: WO00/16391

PCT Pub. Date: Mar. 23, 2000

(30) Foreign Application Priority Data

Sep. 14, 1998 (JP) .......................................... 10-259876

(51) Int. Cl.⁷ ............................................ H01L 21/338
(52) U.S. Cl. ........................ 438/184; 438/767; 438/752
(58) Field of Search ................................ 438/184, 767, 438/752

(56) References Cited

U.S. PATENT DOCUMENTS

| | | | |
|---|---|---|---|
| 4,835,112 A | * 5/1989 | Pfiester et al. ................. | 438/10 |
| 4,920,076 A | * 4/1990 | Holland et al. .............. | 438/200 |
| 4,937,206 A | 6/1990 | Jaffe et al. | |
| 5,296,387 A | * 3/1994 | Arpmpwotz et al. .......... | 438/10 |
| 5,726,459 A | * 3/1998 | Hsu et al. ..................... | 257/55 |
| 5,879,996 A | * 3/1999 | Forbes ........................ | 438/289 |

FOREIGN PATENT DOCUMENTS

| | | |
|---|---|---|
| JP | 54-4065 A | 1/1979 |
| JP | 5-226620 A | 9/1993 |
| JP | 07-166353 | 6/1995 |
| JP | 7-288238 A | 10/1995 |
| JP | 7-321178 A | 12/1995 |
| JP | 8-33539 A | 6/1996 |
| JP | 10-198403 A | 7/1998 |
| JP | 11-283892 A | 10/1999 |
| WO | WO 92/20102 A1 | 11/1992 |

OTHER PUBLICATIONS

C.A. King, et al., "Si/Si1−xGex Heterojunction Bipolartransistors Produced by Limited Reaction Processing", IEEE Electron Device Letters, 1989, vol. 10, No. 2, p.52–54.

* cited by examiner

Primary Examiner—Richard Elms
Assistant Examiner—Pho Luu
(74) Attorney, Agent, or Firm—McDermott, Will & Emery

(57) ABSTRACT

A process control is performed for fabricating both a wafer for a device including a Ge-containing semiconductor film and a wafer for a device, for example, including no Ge-containing semiconductor film on a common fabrication line. When the wafer including the Ge-containing semiconductor film is to be subjected to high-temperature treatment at 700° C. or more in the state of the Ge-containing semiconductor film being substantially exposed, the Ge-containing semiconductor film is covered with a cap layer made of Si or the like before the high-temperature treatment. The cap layer may be formed on the common fabrication line. However, if the formation of the cap layer itself involves high temperature of 700° C. or more, it is performed on a fabrication line separate from the common fabrication line. Alternatively, the cap layer may be formed on a fabrication line separate from the common fabrication line and the high-temperature treatment at 700° C. or more may also be performed on a separate fabrication line. Otherwise, it suffices to only perform the high-temperature treatment at 700° C. or more on a separate line.

14 Claims, 9 Drawing Sheets

METHOD FOR FABRICATING SEMICONDUCTOR DEVICE

TECHNICAL FIELD

The present invention relates to a fabrication method that prevents cross-contamination in a fabrication process of a semiconductor device containing Ge.

BACKGROUND ART

In recent years, examination has been actively made for commercialization of semiconductor devices containing Ge, especially, semiconductor devices using mixed crystal semiconductor materials such as SiGe and SiGeC. In particular, a SiGe mixed crystal semiconductor has a feature of having a band gap narrower than Si and a high hole mobility. By utilizing this feature, for example, by using SiGe mixed crystal as the base layer of a Si bipolar transistor, the high frequency characteristic of the bipolar transistor can be improved. Such a semiconductor device using SiGe has advantages of being inexpensive and easy in attainment of high integration compared with devices using compound semiconductors such as GaAs. One reason is that the former can be formed on a Si substrate, which is inexpensive and also easily available as a large-diameter substrate. Another reason is that the former can be fabricated using the existing fabrication line for Si integrated circuits for which high integration technology has been established, in substantially the common fabrication process.

PROBLEMS TO BE SOLVED

It has been found that a cross-contamination phenomenon arises when an attempt is made to fabricate a wafer for forming devices including a SiGe layer and a wafer for forming only MOS devices including no SiGe layer on the same fabrication line. This is a phenomenon that the SiGe layer acts as a contamination source and a device that does not include a SiGe layer, such as a Si device, is contaminated with Ge, whereby the characteristics of the Si device are adversely affected. The reason for this phenomenon is presumably that intrusion of Ge into the Si layer in an active region of a CMOS device or the like causes generation of an impurity level or the like that may serve as a trap or a recombination center.

In order to avoid the above problem, an exclusive line may be provided for devices including a component made of a Ge-containing material, such as a SiGe layer, a SiGeC layer, and a GeC layer, and distinctively separated from the fabrication line for general CMOS devices and the like. However, provision of a new fabrication line requires a great investment, and above all, this leads to loss of the advantage of the devices using a SiGe layer, a SiGeC layer, and the like of being able to use the common fabrication process with MOS devices.

In addition, in view of recent progress in system LSI and the like, it is presumed that a need will arise for fabrication of a "consolidated" device where a CMOS device and a SiGe device are formed in a common wafer. Expectation is therefore placed on establishment of a means for reliably preventing the cross-contamination phenomenon.

The object of the present invention is to provide a method for fabricating a semiconductor device in which a wafer including a Ge-containing semiconductor film and a wafer including no Ge-containing semiconductor film are fabricated using a common fabrication line as much as possible.

This is attained by understanding the conditions under which the cross-contamination phenomenon arises and establishing a means for reliably preventing the cross-contamination based on the examination results

SUMMARY OF THE INVENTION

The first method for fabricating a semiconductor device of the present invention is a method for fabricating a semiconductor device including a Ge-containing semiconductor film using a common fabrication line for processing both a wafer including a Ge-containing semiconductor film and a wafer including no Ge-containing semiconductor film. The method includes the steps of: (a) substantially exposing the Ge-containing semiconductor film; (b) forming a cap layer having a function of blocking scattering of Ge in the air on the Ge-containing semiconductor layer; and (c) treating the wafer including the Ge-containing semiconductor layer at a temperature of 700° C. or more after the step (b).

By adopting the above method, in the step (c), the high-temperature treatment at 700° C. or more is performed in the state where the Ge-containing semiconductor film is covered with the cap layer. Therefore, Ge is blocked from scattering in the air even when this high-temperature treatment is per, formed on the common fabrication line. This means that when a wafer including no Ge-containing semiconductor film is to be processed on the common fabrication line, the wafer is suppressed from causing cross-contamination due to intrusion of Ge into the active region thereof.

Specifically, in the first method for fabricating a semiconductor device, any of the following procedures may be adopted.

The step (b) may be performed on a fabrication line separate from the common fabrication line, and the step (c) may be performed on the common fabrication line. This method is especially effective when the formation of the cap layer involves high temperature of 700° C. or more.

Both the steps (b), (c) may be performed on the common fabrication line.

Alternatively, the steps (b), (c) may be performed on a fabrication line separate from the common fabrication line.

The method may further include the step of forming another cap layer on the existing cap layer. The additional cap layer is formed for fear that Ge may have been diffused even to a portion close to the surface of the first cap layer.

In the first method for fabricating a semiconductor device, when the temperature in the step (c) is in a range between 700° C. or more and less than 750° C., the cap layer may be made of silicon and may be formed so that a thickness W (nm) and a heat treatment time t (min) satisfy the relationship $$W \geq 0.017 \times t.$$

In the first method for fabricating a semiconductor device, when the temperature in the step (c) is in a range between 750° C. or more and less than 820° C., the cap layer may be made of silicon and may be formed so that a thickness W (nm) and a heat treatment time t (min) satisfy the relationship:

$$W \geq 0.046 \times t.$$

In the first method for fabricating a semiconductor device, when the temperature in the step (c) is 820° C. or more, the cap layer may be made of silicon and may be formed so that a thickness W (nm) and a heat treatment time t (min) satisfy the relationship:

$$W \geq 0.063 \times t.$$

The second method for fabricating a semiconductor device of the present invention is a method for fabricating a semiconductor device including a Ge-containing semiconductor film using a common fabrication line for processing both a wafer including a Ge-containing semiconductor film and a wafer including no Ge-containing semiconductor film. The method includes the steps of: (a) substantially exposing the Ge-containing semiconductor film; and (b) processing the wafer including the Ge-containing semiconductor film at a temperature of 700° C. or more on a fabrication line separate from the common fabrication line after the step (a).

By adopting the above method, since the treatment at 700° C. or more is not performed on the common fabrication line, scattering of Ge in the air is prevented on the common fabrication line. This means that when a wafer including no Ge-containing semiconductor film is to be processed on the common fabrication line, the wafer is suppressed from causing cross-contamination due to intrusion of Ge into the active region thereof.

In the second method for fabricating a semiconductor device, the method further includes the steps of: (c) forming a cap layer having a function of blocking scattering of Ge in the air on the Ge-containing semiconductor film after the step (b). Therefore, the subsequent process is performed with the existence of the cap layer in which Ge is scarcely diffused. This further ensures suppression of cross-contamination.

In the first or second method for fabricating a semiconductor device, the Ge-containing semiconductor film is preferably made of at least one of SiGe, SiGeC, GeC, and Ge.

In the first or second method for fabricating a semiconductor device, the cap layer is preferably made of at least one of silicon, silicon oxide, silicon nitride, and silicon oxynitride.

BEST EMBODIMENTS

Elucidation on Conditions of Generation of Cross-contamination

First, the process of understanding of the conditions under which cross-contamination is generated will be described.

From the examination on the situation at the fabrication of a hetero bipolar transistor (HBT), for example, including a SiGe layer using a fabrication line for CMOS process, it was presumed that most suspected as the cause of the cross-contamination was diffusion of Ge in the air during heat treatment of devices including SiGe. Based on this presumption, the following experiments were performed to examine the heat treatment conditions under which cross-contamination was generated.

First, a SiGe layer having a Ge content of 15% ($Si_{0.85}Ge_{0.15}$ layer) was grown on a (001) Si substrate (Si substrate of which the principal plane is (001) plane) by UHV-CVD. The resultant sample was put in a low-speed ion scattering analyzing apparatus provided with a substrate heating mechanism, and was observed on the spot by a low-energy ion scattering spectroscopy to examine the degree of release of Ge from the surface of the SiGe layer during heat treatment. The substrate was heated with a graphite heater at a temperature rise/fall speed of 20° C./min and a heat treatment temperature in the range of room temperature to 900° C.

Figure 1:
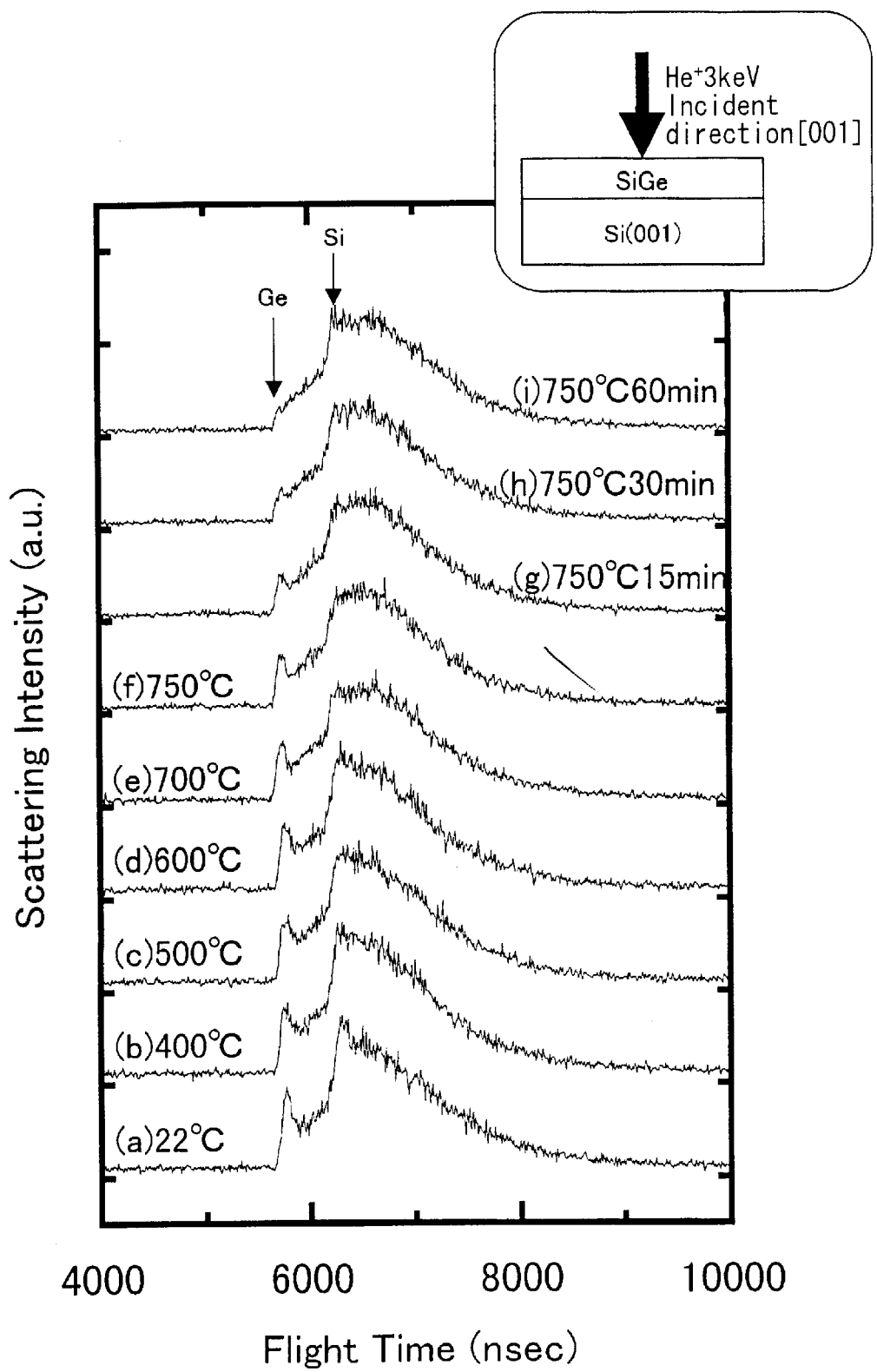
FIGS. 1((a) to (i)) is a view showing a change in the spectrum (TOF spectrum) with respect to the flight time during temperature rise.

FIGS. 1((a) through (i)) is a view showing a change in the spectrum (TOF spectrum) with respect to the flight time during temperature rise. As shown in the upper right portion of FIG. 1, upon irradiation of helium ions ($He^+$) in the surface portion of the substrate, part of the helium ions (mass: m) that have collided with surface atoms (mass: M) are scattered in a direction of 180° with respect to the incident direction. The flight time of the scattered ions from the sample surface to a detector is proportional to $(M+m)/(M-m)$. Since the element that contributes to each peak value of the spectrum is known, it is possible to specify an element included in the substrate surface by measuring the spectrum (TOF spectrum) with respect to the flight time. In the illustrated example, $He^+$ was irradiated to the substrate at an accelerating energy of 3 keV.

As shown in FIG. 1(a), the TOF spectrum (a) for the substrate before heat treatment (that is, at room temperature 22° C.) had scattering peaks associated with Si atoms and Ge atoms existing in the surface portion of the SiGe layer at around 6400 nsec and around 5800 nsec, respectively.

As shown in FIGS. 1(b) to (e), no large change was observed in the shape of the spectrum during the rise of the substrate temperature to 700° C.

As shown in FIGS. 1(f) to (h), the intensity of the peak associated with Ge atoms in the TOF spectrum gradually decreased with time when the substrate temperature was raised to 750° C. and held at this temperature.

As shown in FIG. 1(i), the scattering peak associated with Ge atoms was hardly observed in the TOF spectrum after holding of the temperature for 60 minutes. This indicates that Ge atoms was released from the surface portion of the SiGe layer due to the heat treatment at 750° C.

From the above results, it is found that when a substrate having an exposed SiGe layer at the surface thereof is heat-treated at a temperature of 700° C. or more on a fabrication line, cross-contamination may possibly be generated in a Si device fabricated on the same fabrication line.

Cap Layer for Prevention of Cross-contamination

It is practically difficult to omit heat treatment at 700° C. for a wafer including a SiGe layer. Therefore, when heat treatment at 700° C. or more is performed for a wafer having an exposed Ge-containing region such as a SiGe layer, it may be effective to provide a cap layer on the SiGe layer or the like for prevention of Ge diffusion in the air as a means for preventing cross-contamination. Based on this idea, an experiment was made for providing a cap layer made of a material that is not harmful on the fabrication line for CMOS devices and the like and that can be left unremoved on the SiGe layer without being harmful or can be easily removed afterward. Examples of a layer usable as such a cap layer include a Si layer (a single-crystalline layer, a polysilicon layer, or an amorphous silicon layer), a $SiO_2$ layer, a $Si_2N_3$ layer, a SiON (a so-called oxynitride film), and multilayer films thereof.

The Si layer was selected as being the most general cap layer, and examined was the optimum thickness of the Si layer for attaining prevention of Ge diffusion in the air.

A SiGe layer having a Ge content of 15% ($Si_{0.85}Ge_{0.15}$ layer) was grown on a (001) Si substrate by UHV-CVD, and a cap layer composed of a Si layer having a thickness of 10 nm was grown on the SiGe layer. That is, a sample of the SiGe layer covered with the Si layer was formed. The sample was heat-treated at 750° C. for 30 minutes.

Figure 2A:
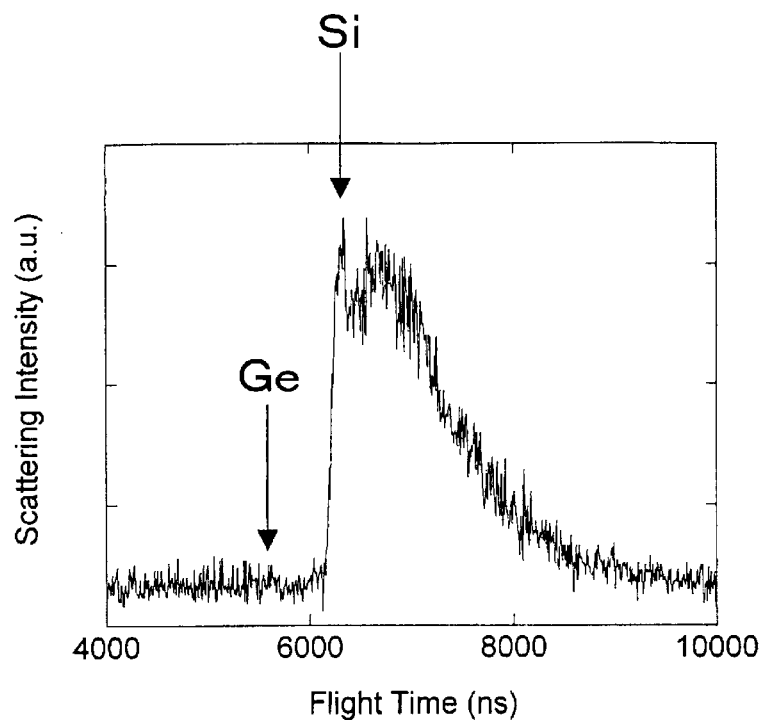
FIGS. 2(a) and 2(b) are views of TOF spectra showing the results of analysis of the composition of a surface layer (Si cap layer) of a substrate before and after heat treatment, respectively, by a low-energy ion scattering spectroscopy.
Figure 2B:
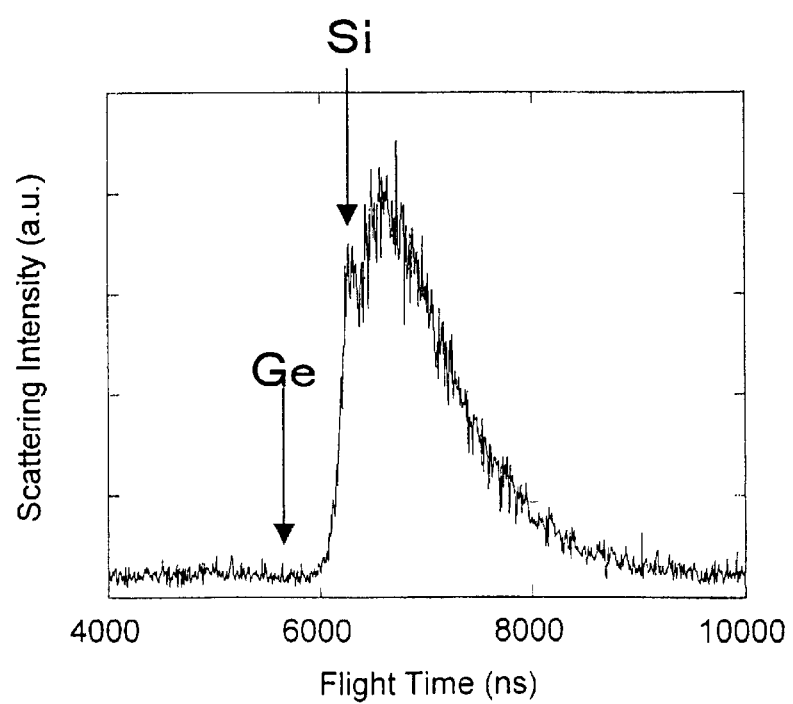

FIGS. 2(a) and 2(b) are views of TOF spectra showing the results of analysis of the composition of the surface layer (Si cap layer) of the substrate before and after the heat treatment, respectively, by the low-energy ion scattering spectroscopy. Referring to FIG. 2(a) showing the TOF spectrum before the heat treatment, no signal for Ge was detected, but only a signal for Si was measured since the surface was covered with Si. In the TOF spectrum after the heat treatment at 750° C., also, only a signal for Si was measured as shown in FIG. 2(b). No diffusion of Ge atoms from the SiGe layer to the top surface of the Si cap layer was observed. Therefore, the Ge amount released from this sample was found very small compared with the case having an exposed SiGe layer. This result indicates that the covering of the SiGe layer with the Si layer is effective in prevention of cross-contamination.

With the above experiment alone, the optimum thickness of the Si cap layer is not determined. As a result of further examination, it was found that the thickness of the Si layer required for prevention of cross-contamination varied with the heat treatment temperature and time.

Heat treatment was performed under a variety of conditions for samples including a SiGe layer having a Ge content of 15% ($Si_{0.85}Ge_{0.15}$ layer) and a Si cap layer having a thickness of 10 nm formed on a (001) Si substrate. The resultant heat-treated samples were analyzed by the low-energy ion scattering spectroscopy to experimentally calculate the diffusion speed of Ge in the Si layer.

As a result, it was found that the diffusion speeds of Ge in the Si layer at 700° C., 750° C., and 820° C. were 0.017 nm/min, 0.046 nm/min, and 0.063 nm/min, respectively.

Treatments involving exposure of a wafer to such a high temperature include, not only annealing (heat treatment), but also treatments required to be performed at a high temperature such as CVD and the like. As used herein, all such treatments performed at a high temperature are collectively referred to as "high-temperature treatment". It is therefore found from the above results that cross-contamination can be prevented by setting the thickness W (nm) of the Si cap layer with respect to the high-temperature treatment time t (min) as follows depending on the temperature range of the high-temperature treatment.

(1) In the case of the temperature range between 700° C. or more and less than 750° C.:

$$W \geq 0.017 \times t$$

(2) In the case of the temperature range between 750° C. or more and less than 820° C.:

$$W \geq 0.046 \times t$$

(3) In the case of the temperature range of 820° C. or more:

$$W \geq 0.063 \times t$$

The above conditions on the material, the thickness with respect to the high-temperature treatment time, and the like of the cap layer are also substantially applicable to the case that a SiGeC layer, a GeC layer, a Ge layer, or the like is exposed.

Process for Prevention of Cross-contamination

Next, based on the elucidated results on the conditions of generation of cross-contamination, how the process control should be performed will be described including formation of the cap layer for prevention of cross-contamination.

In general, it requires a great investment to provide an exclusive line for fabrication of devices including a SiGe layer and the like over the entire process, and thus this is impractical. Hereinafter, therefore, a process control (management) method for the following case will be described. That is, a fabrication line for normal CMOS devices is used as a common line, and as a separate line for devices including a SiGe layer, provided is a fabrication line for processing only a locally defined step.

Figure 3A:
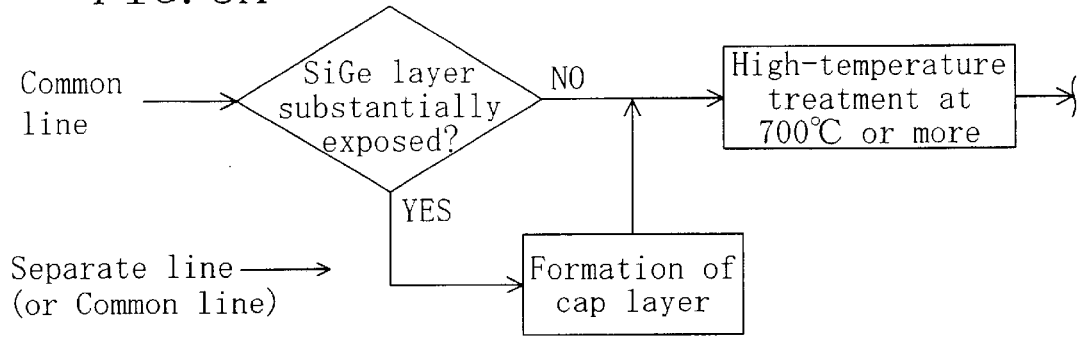
FIGS. 3(a) through 3(c) are flowcharts of examples of process control in a fabrication process of a semiconductor device on a common fabrication line that includes a treatment involving exposure at a high temperature of 700° C. or more (high-temperature treatment).
Figure 3B:
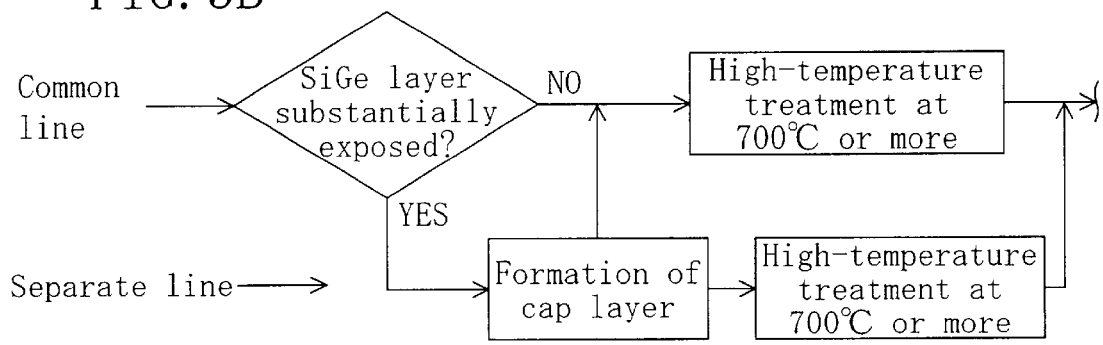
Figure 3C:
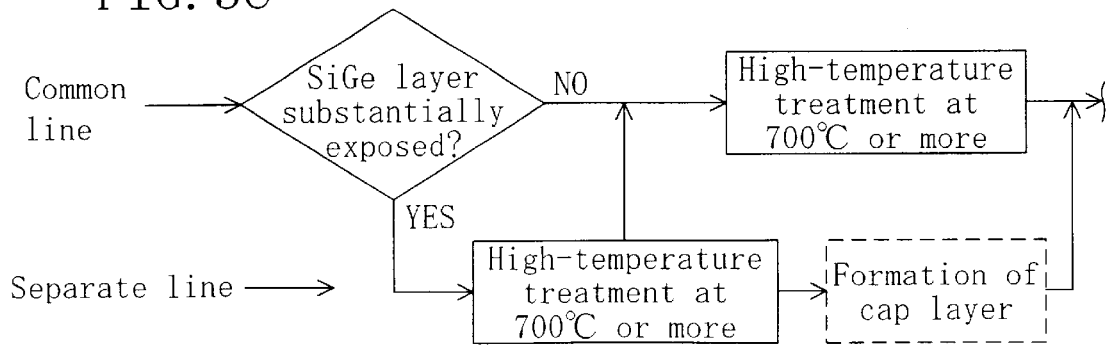

FIGS. 3(a) through 3(c) are flowcharts showing examples of process control in a fabrication process for a semiconductor device using a common line, where the fabrication process includes a step of performing a treatment involving exposure to a high temperature of 700° C. or more (high-temperature treatment).

In any of FIGS. 3(a) through 3(c), prior to the execution of the high-temperature treatment at 700° C. or more on the common line, whether or not there is an exposed SiGe layer on the surface of the wafer is determined. If there is no exposed SiGe layer, the process proceeds to the high-temperature treatment at 700° C. or more on the common line. Note that when an oxide film, nitride film, or Si layer too thin to prevent Ge scattering in the air by itself is formed on the SiGe layer, it is determined that the SiGe layer is substantially exposed because such an oxide film, nitride film, or Si layer fails to serve as the cap layer as defined herein.

In the example shown in FIG. 3(a), when the SiGe layer in the wafer is substantially exposed, the wafer is moved from the common line to a separate line (or kept unmoved on the common line), where the SiGe layer is covered with a cap layer such as a Si layer. The resultant wafer is then returned to the common line and subjected to the high-temperature treatment at 700° C. or more, followed by the subsequent process. By this method, since Ge diffusion in the air on the common line is blocked by the existence of the cap layer, the high-temperature treatment at 700° C. or more can be performed on the common line. Thus, cross-contamination is prevented. If the formation of the cap layer does not involve holding of the temperature at 700° C. or more, the cap layer may be formed on the common line.

In the example shown in FIG. 3(b), when the SiGe layer in the wafer is substantially exposed, the wafer is moved from the common line to a separate line, where the SiGe layer is covered with a cap layer such as a Si layer. The resultant wafer is subjected to the high-temperature treatment at 700° C. or more in the separate line, and then returned to the common line, followed by the subsequent process. If the SiGe layer is not substantially exposed, the high-temperature treatment at 700° C. or more is performed on the common line, followed by the subsequent process. By this method, the high-temperature treatment at 700° C. or more will not be performed on the common line if the SiGe layer of the wafer is substantially exposed. This prevents Ge diffusion in the air on the common line. Thus, cross-contamination is prevented. Note that the high-temperature treatment at 700° C. or more may be performed on the common line.

In the methods shown in FIGS. 3(a) and 3(b), an additional cap layer may be formed on the existing cap layer after the high-temperature treatment at 700° C. or more on the common line or the separate line. This is done for fear that Ge may have diffused to a portion near the surface of the first cap layer during the high-temperature treatment at 700° C. or more. In this case, double cap layers are formed and the total thickness increases. This is however acceptable as long as no inconvenience arises in the subsequent process.

In the example shown in FIG. 3(c), when the SiGe layer in the wafer is substantially exposed, the wafer is moved from the common line to a separate line, where the high-temperature treatment at 700° C. or more is performed and then the SiGe layer is covered with a cap layer such as a Si layer. The wafer is then returned to the common line, followed by the subsequent process. If the SiGe layer in the wafer is not substantially exposed, the high-temperature treatment at 700° C. or more is performed on the common line, followed by the subsequent process. By this method, the high-temperature treatment at 700° C. or more will not be performed on the common line if the SiGe layer in the wafer is substantially exposed. This prevents Ge diffusion in the air on the common line. Thus, cross-contamination is prevented. In addition, in this case, the cap layer is not subjected to the high-temperature treatment at 700° C. or more, and therefore scarcely includes Ge diffused therein. This further ensures suppression of Ge diffusion in the air from the cap layer in the subsequent process. Note that if the formation of the cap layer does not involve high-temperature treatment at 700° C. or more (such as formation by low-temperature CVD), the cap layer may be formed on the common line.

In the case of performing high-temperature treatment at 700° C. or more before or after any of the processes shown in FIGS. 3(a) through 3(c), also, inconvenience relating to Ge diffusion into an equipment on the common line can be prevented by performing any of the process controls shown in FIGS. 3(a) through 3(c).

EXAMPLES OF FABRICATION PROCESS FOR HCMOS DEVICE

First Example

How the process for preventing cross-contamination is practically performed in the fabrication process of a hetero-structure CMOS (HCMOS) device will be described. FIGS. 4(a) through 4(f) are cross-sectional views illustrating the first example of the fabrication process for an HCMOS device including a channel region made of a Ge-containing semiconductor layer.

Figure 4A:
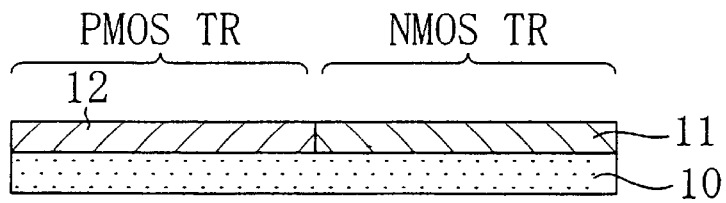
FIGS. 4(a) through 4(f) are cross-sectional views illustrating the first example of a fabrication process for an HCMOS device having a channel region made of a Ge-containing semiconductor layer.

First, in the step shown in FIG. 4(a), a p-well 11 and an n-well 12 are formed in a Si substrate 10 by ion implantation. This step is performed on a fabrication line for normal CMOS devices, that is, a common line.

Figure 4B:
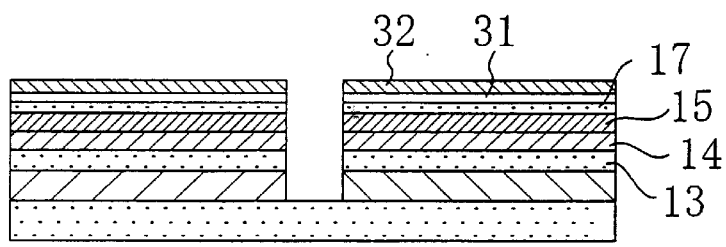

In the step shown in FIG. 4(b), a Si layer 13 including a δ-doped layer, a SiGeC layer 14 (Ge:8.2%, C:1%), a SiGe layer 15, and a Si layer 17 are sequentially grown on the wells 11 and 12. The Si layer 17 is formed to prevent the SiGe layer 15 from being substantially exposed in the subsequent process and has a thickness satisfying any of expressions (1) to (3) above, for example.

The δ-doped layer (carrier supply layer) doped with high-concentration impurities exists in the vicinity of the top surface of the Si layer 13, and a spacer layer made of a non-doped SiGe layer is formed between the Si layer 13 and the SiGeC layer 14. Illustration of these layers is however omitted for easy recognition. The step shown in FIG. 4(b) is performed on an exclusive line provided separately from the common line.

Alternatively, the formation of the Si layer 13 including the δ-doped layer may be performed on the common line, and the formation of the spacer layer, the SiGeC layer 14, the SiGe layer 15, and the Si layer 16 may be performed in the separate line.

Subsequently, a trench for trench isolation is formed for electrical isolation between a PMOS transistor and an NMOS transistor. Specifically, a pad oxide film 31 and a nitride film 32 are sequentially deposited on the resultant substrate, and patterned to form an opening at part of the nitride film 32 and pad oxide film 31 (trench formation region) by photolithography and etching. Using the nitride film 32 as a mask, part of the underlying Si layer 17, SiGe layer 15, SiGeC layer 14, Si layer 13, and the like are removed by etching, to form a trench. By this formation of the trench, the SiGeC layer 14 and the SiGe layer 15 are exposed at the sidewall of the trench.

Figure 4C:
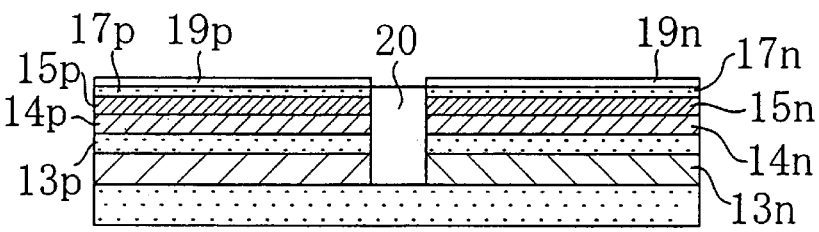

In the step shown in FIG. 4(c), the trench is filled with a silicon oxide film to form trench isolation 20. Specifically, a silicon oxide film is deposited on the substrate and then flattened with CMP or the like. Note that if the step of depositing the silicon oxide film for trench filling is performed by low-temperature CVD or the like at 700° C. or less, all of the series of steps shown in FIGS. 4(b) and 4(c) can be performed on the common line.

By the formation of the trench isolation 20 described above, the Si layer 13, the SiGeC layer 14, the SiGe layer 15, and the Si layer 17 are divided into a Si layer 13n, a SiGeC layer 14n, a SiGe layer 15n, and a Si layer 17n on the side of the NMOS transistor and a Si layer 13p, a SiGeC layer 14p, a SiGe layer 15p, and a Si layer 17p on the side of the PMOS transistor. The nitride film 32 and the pad oxide film 31 are removed, and then the surfaces of the Si layers 17n, 17p are oxidized to form gate insulating films 19n, 19p. This process is performed on the common line. The thickness of the Si layer 17 formed in the step shown in FIG. 4(b) is therefore set to satisfy any of expressions (1) to (3) in consideration of reduction in thickness due to this thermal oxidation.

Figure 4D:
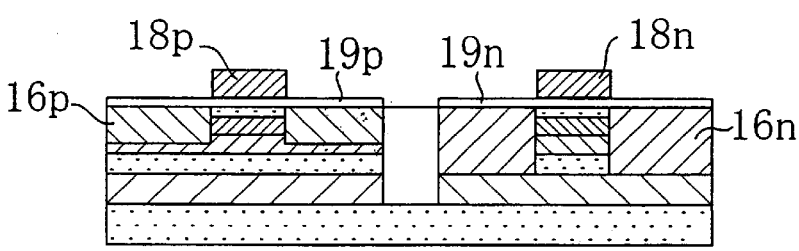

In the step shown in FIG. 4(d), a polysilicon film is deposited over the entire surface of the substrate, and patterned to form gate electrodes 18n, 18p on the gate insulating films 19n, 19p of the NMOS transistor and the PMOS transistor, respectively. Thereafter, using the gate electrodes 18n, 18p as masks, phosphorus ions (P+) are implanted in the area of the NMOS transistor to form source/drain regions 16n, and boron ions (B+) are implanted in the area of the PMOS transistor to form source/drain regions 16p. The source/drain regions 16n of the NMOS transistor must be deeper than at least the level of the carrier accumulation layer in the SiGeC layer 14n, while the source/drain regions 16p of the PMOS transistor must be deeper than at least the level of the carrier accumulation layer in the SiGe layer 15p. The reason is that channels are formed in the carrier accumulation layers in the SiGeC layer 14n and the SiGe layer 15p.

Figure 4E:
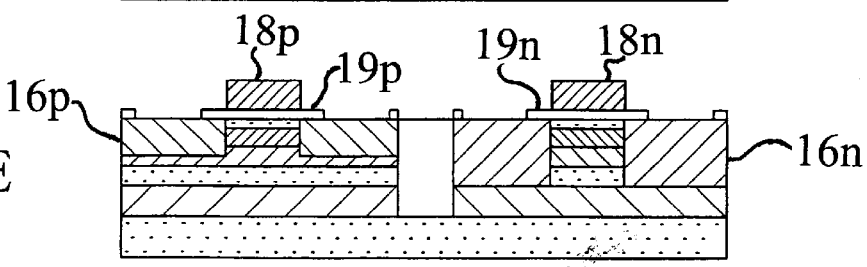

In the step shown in FIG. 4(e), openings are formed through the gate insulating films 19n, 19p at positions above the source/drain regions 16n, 16p. In the step shown in FIG. 4(f), source/drain electrodes 21n, 21p are formed in the openings of the gate insulating films 19n, 19p. This formation of the source/drain electrodes 21n, 21p generally involves high-temperature treatment at 700° C. or more (in general, 800 to 1000° C.). In the process of forming the openings through the gate insulating films 19n, 19p above the source/drain regions 16n, 16p, the Si layer 17n, 17p may be thinned due to over-etching, and thus Ge may be scattered in the air from the SiGe layers 15n, 15p existing in the source/drain regions 16n, 16p. Therefore, the formation of the source/drain electrodes is preferably performed on the line separate from the common line. Note that the formation of the source/drain electrodes may be performed on the common line if there is no intrusion of Ge into the Si layer in the active region in the step of forming the source/drain electrodes in the fabrication process for a CMOS device.

Thus, the HCMOS device composed of the NMOS transistor and the PMOS transistor formed on the Si substrate 10 is fabricated.

Second Example

FIGS. 5(a) through 5(d) are cross-sectional views illustrating the second example of the fabrication process for an HCMOS device including a channel region made of a Ge-containing semiconductor layer.

Figure 5A:
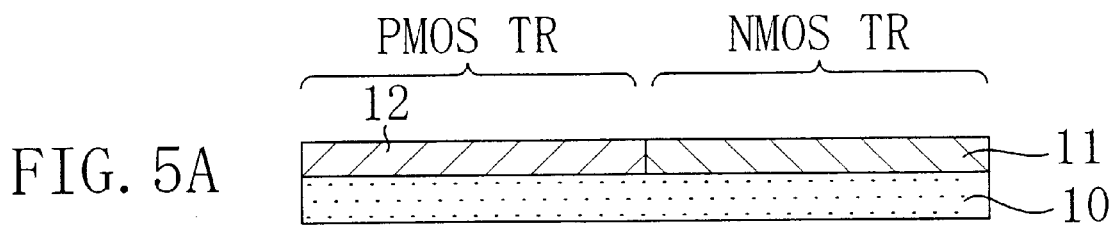
FIGS. 5(a) through 5(d) are cross-sectional views illustrating the second example of a fabrication process for an HCMOS device having a channel region made of a Ge-containing semiconductor layer.

First, in the step shown in FIG. 5(a), a p-well 11 and an n-well 12 are formed in a Si substrate 10 by ion implantation. This step is performed on a fabrication line for normal CMOS devices, that is, a common line.

Figure 5B:
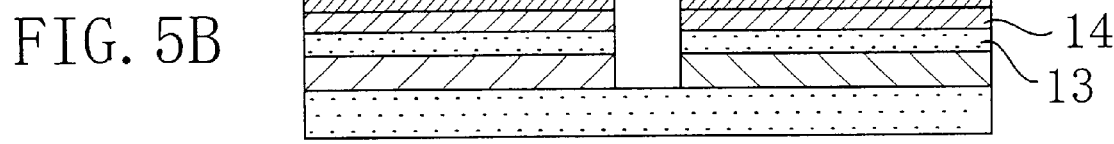

In the step shown in FIG. 5(b), a Si layer 13 including a δ-doped layer, a SiGeC layer 14 (Ge:8.2%, C:1%), a SiGe layer 15, and a Si layer 17 are sequentially grown on the wells 11 and 12 by UHV-CVD. The Si layer 17 is formed to prevent the SiGe layer 15 from being substantially exposed in the subsequent process and has a thickness satisfying any of expressions (1) to (3) above.

The δ-doped layer (carrier supply layer) doped with high-concentration impurities exists in the vicinity of the top surface of the Si layer 13, and a spacer layer made of a non-doped SiGe layer is formed between the Si layer 13 and the SiGeC layer 14. Illustration of these layers is however omitted for easy recognition. The process control until this step is substantially the same as that described in the first example.

Subsequently, a trench for trench isolation is formed for electrical isolation between a PMOS transistor and an NMOS transistor. Specifically, a pad oxide film 31 and a nitride film 32 are sequentially deposited on the resultant substrate, and patterned to form an opening at part of the nitride film 32 and pad oxide film 31 (trench formation region) by photolithography and etching. Using the nitride film 32 as a mask, part of the underlying Si layer 17, SiGe layer 15, SiGeC layer 14, Si layer 13, and the like are removed by etching, to form a trench. By this formation of the trench, the SiGeC layer 14 and the SiGe layer 15 are exposed at the sidewall of the trench.

Figure 5C:
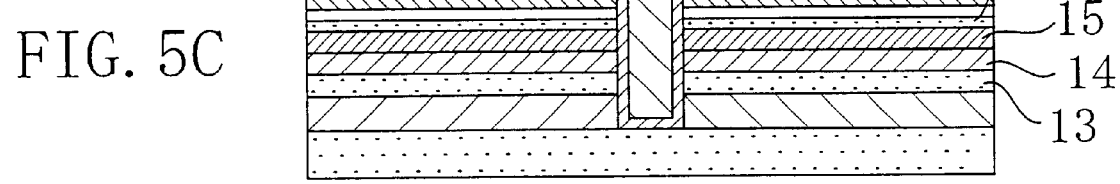

In the step shown in FIG. 5(c), an underlying nitride film 33 is formed over the entire surface of the substrate, and then a thick filling polysilicon film 34 is deposited on the entire surface of the substrate. The step of forming the underlying nitride film 33 generally involves high-temperature treatment in the range of about 700 to 800° C., and thus performed on a line separate from the common line. The underlying nitride film 33 serves as a cap layer for preventing Ge scattering in the air. Therefore, the formation of the filling polysilicon film 34 can be performed on the common line. In place of the underlying nitride film 33, an oxide film may be formed.

Figure 5D:
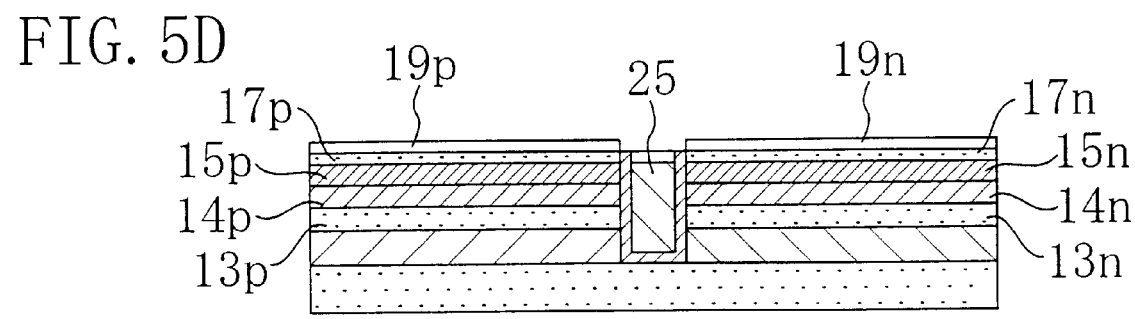

In the step shown in FIG. 5(d), device isolation 25 made of the polysilicon is formed at the trench by flattening the polysilicon by CMP or the like. The upper portion of the device isolation 25 is a thick oxide film formed of oxidized polysilicon.

By the formation of the trench isolation 25 described above, the Si layer 13, the SiGeC layer 14, the SiGe layer 15, and the Si layer 17 are divided into a Si layer 13n, a SiGeC layer 14n, a SiGe layer 15n, and a Si layer 17n on the side of the NMOS transistor and a Si layer 13p, a SiGeC layer 14p, a SiGe layer 15p, and a Si layer 17p on the side of the PMOS transistor. The nitride film 32 and the pad oxide film 31 are removed, and then the surfaces of the Si layers 17n, 17p are oxidized to form gate insulating films 19n, 19p. This process is performed on the common line. The thickness of the Si layer 17 formed in the step shown in FIG. 5(b) is therefore set to satisfy any of expressions (1) to (3) in consideration of reduction in thickness due to this thermal oxidation.

Figure 4F:
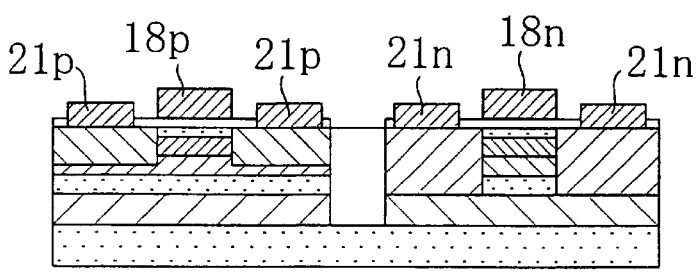

The subsequent steps are the same as those described in the first example with reference to FIGS. 4(d) through 4(f). Illustration and description of these steps are therefore omitted here.

Example of Fabrication Process for HBT

How the process for preventing cross-contamination is practically performed in the fabrication process for a hetero bipolar transistor (HBT) will be described. FIGS. 6(a) through 6(k) are cross-sectional views illustrating the fabrication process for an HBT including a base layer made of SiGe.

Figure 6A:
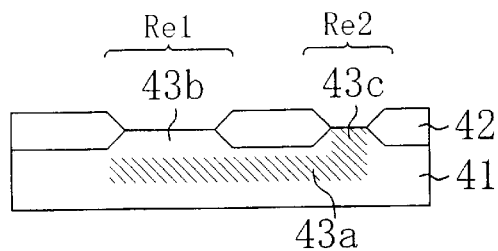
FIGS. 6(a) through 6(k) are cross-sectional views illustrating an example of a fabrication process for an HBT having a base layer made of SiGe.

In the step shown in FIG. 6(a), a sub-collector layer 43a doped with high-concentration n-type impurities is formed in a Si substrate 41. A Si single-crystalline film doped with low-concentration n-type impurities is epitaxially grown on the substrate, and a LOCOS film 42 is formed on the Si single-crystalline film so as to surround first and second active regions $R_{e1}$, $R_{e2}$. The epitaxial Si single-crystalline film serves as a Si collector layer 43b in the first active region $R_{e1}$ and as a collector wall layer 43c in the second active region $R_{e2}$. This step shown in FIG. 6(a) is performed on the common line.

Figure 6G:
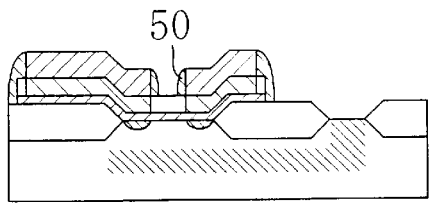
Figure 6B:
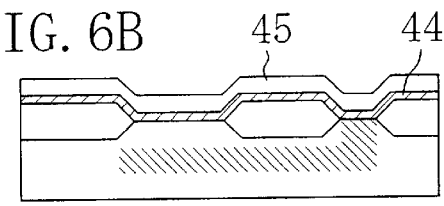

In the step shown in FIG. 6(b), a boron-doped p-type SiGe layer 44 having a thickness of about 50 nm and a phosphorus-doped Si layer 45 having a thickness of about 150 nm are epitaxially grown sequentially on the entire surface of the substrate by UHV-CVD. The SiGe layer 44 and the Si layer 45 are single-crystalline at the portions located above the exposed silicon surface and polycrystalline at the portions located above the LOCOS films 42. The formation of the SiGe layer 44 and the Si layer 45 is performed in an exclusive line separate from the common line. The subsequent steps until the step shown in FIG. 6(e) are also performed in the separate line.

Figure 6H:
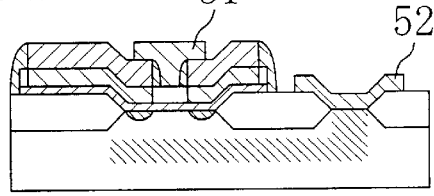
Figure 6C:
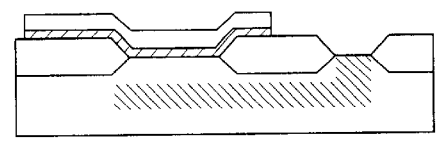

In the step shown in FIG. 6(c), the SiGe layer 44 and the Si layer 45 are removed by dry etching except for the portions thereof that are to serve as an active base layer and a drawing base electrode.

Figure 6I:
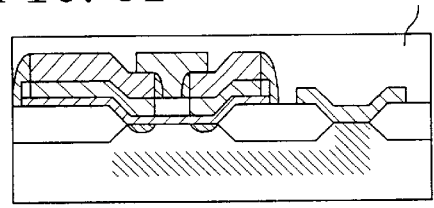
Figure 6D:
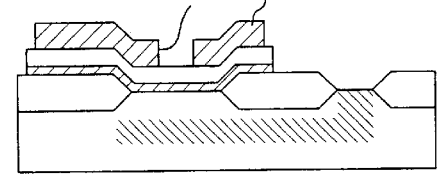

In the step shown in FIG. 6(d), a boron silicate glass (BSG) film 46 containing about 8% of boron is formed on the entire surface of the substrate to a thickness of about 200 nm by atmospheric CVD, and then patterned by photolithography and dry etching to remove the portion thereof located above the second active region $R_{e2}$ and also form an opening 46a for formation of an emitter electrode above the first active region $R_{e1}$.

Figure 6J:
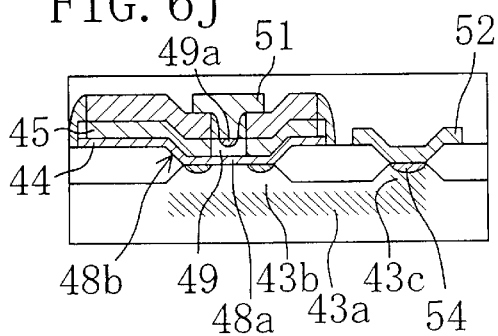
Figure 6E:
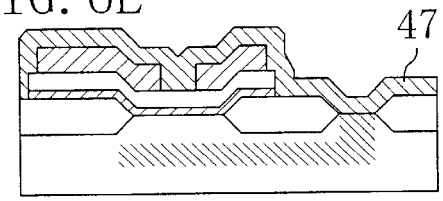

In the step shown in FIG. 6(e), a protection oxide film 47 having a thickness of about 100 nm is deposited on the entire surface of the substrate by CVD. During the subsequent step of boron diffusion from the BSG film 46, boron may come out from the BSG film 46 into the vapor phase, attach to the exposed silicon surface, and diffuse into the substrate. The protection oxide film 47 serves to prevent this boron diffusion to the substrate. In addition, the protection oxide film 47 can prevent Ge diffusion in the air when a treatment at a high temperature of 700° C. or more is performed. Therefore, the steps after the formation of the protection oxide film 47 are performed on the common line.

Figure 6F:
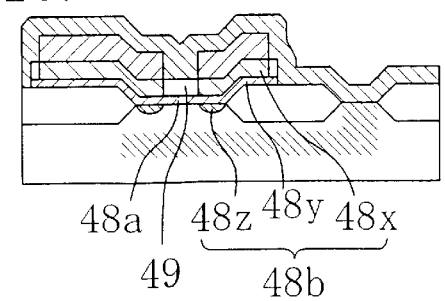

In the step shown in FIG. 6(f), rapid thermal annealing (RTA) at 950° C. for 10 minutes is performed to allow the boron in the BSG film 46 to diffuse into the Si layer 45, the SiGe layer 44, and the collector layer 43b. By this diffusion, portions 48x and 48z of the n-type Si layer 45 and Si collector layer 43b located below the BSG film 46 are converted to p-type, and a portion 48y of the SiGe layer 44 located below the BSG film 46 have higher p-type impurity concentration and thus low resistance. This results in formation of an extrinsic base layer 48b including the portions 48x, 48y, 48z of the Si layer 45, the SiGe layer 44, and the collector layer 43b. The portion of the Si layer 45 into which impurities have not been diffused from the BSG film 46, that is, the portion located below the opening 46a, remains to be n-type and forms a Si emitter layer 49.

In the step shown in FIG. 6(g), the protection oxide film 47 is etched back by anisotropic dry etching, to form sidewalls 50 on the side faces of the BSG film 46. The sidewalls 50 serve to secure isolation of a high-concentration emitter layer to be formed later and the extrinsic base layer. In addition, the sidewalls 50 serve to prevent Ge diffusion in the air from the end face of the SiGe layer 44 during a treatment at a high temperature of 700° C. or more.

In the step shown in FIG. 6(h), a polysilicon film doped with phosphorus at high concentration is formed by LPCVD, and patterned by dry etching to form an emitter electrode 51 in the first active region $R_{e1}$ and a collector electrode 52 in the second active region $R_{e2}$.

In the step shown in FIG. 6(i), an interlayer insulating film 53 made of silicon oxide is deposited by CVD.

In the step shown in FIG. 6(j), phosphorus in the emitter electrode 51 is diffused into the Si emitter layer 49 by heat treatment, to form a high-concentration emitter layer 49a, while phosphorus in the collector electrode 52 is diffused into the collector wall layer 43c, to form a collector contact layer 54.

Figure 6K:
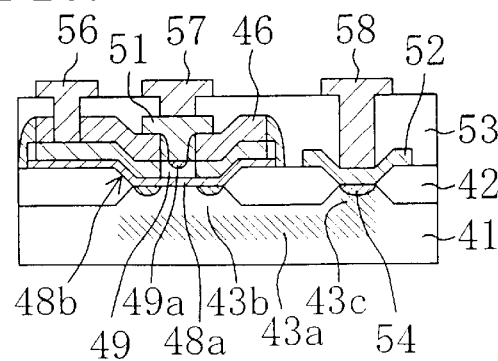

In the step shown in FIG. 6(k), contact holes are formed through the interlayer insulating film 53 to reach the emitter electrode 51, the Si layer 45, and the collector electrode 52. Subsequently, Al interconnections 56, 57, 58 are formed in the contact holes and on the interlayer insulating film 53.

Example of Fabrication Process for BiCMOS

Figure 7:
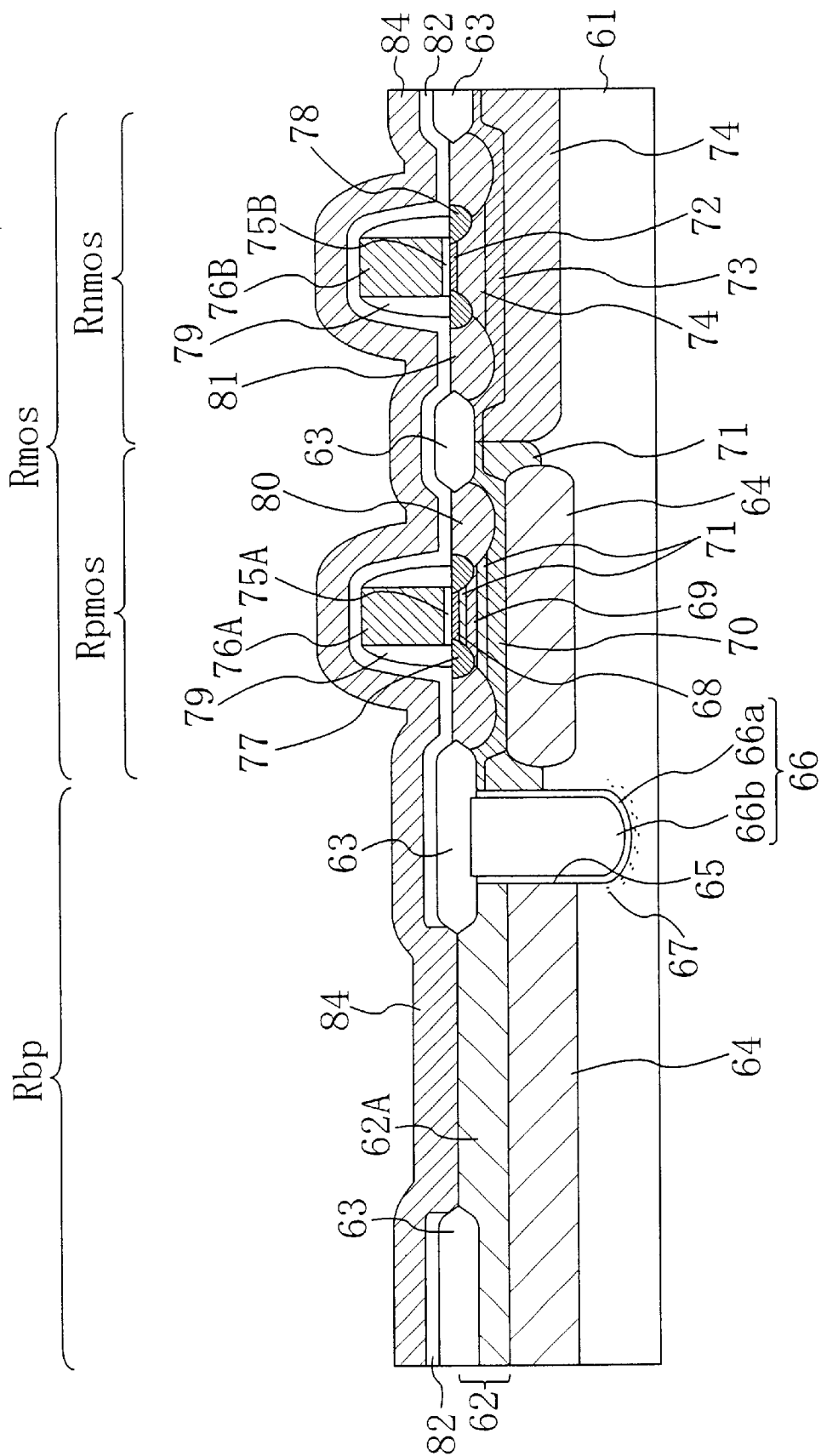
FIG. 7 is a cross-sectional view illustrating a state in a fabrication process for a BiCMOS device including an HBT having a base layer made of SiGe, where a SiGe layer has just been formed.
Figure 8:
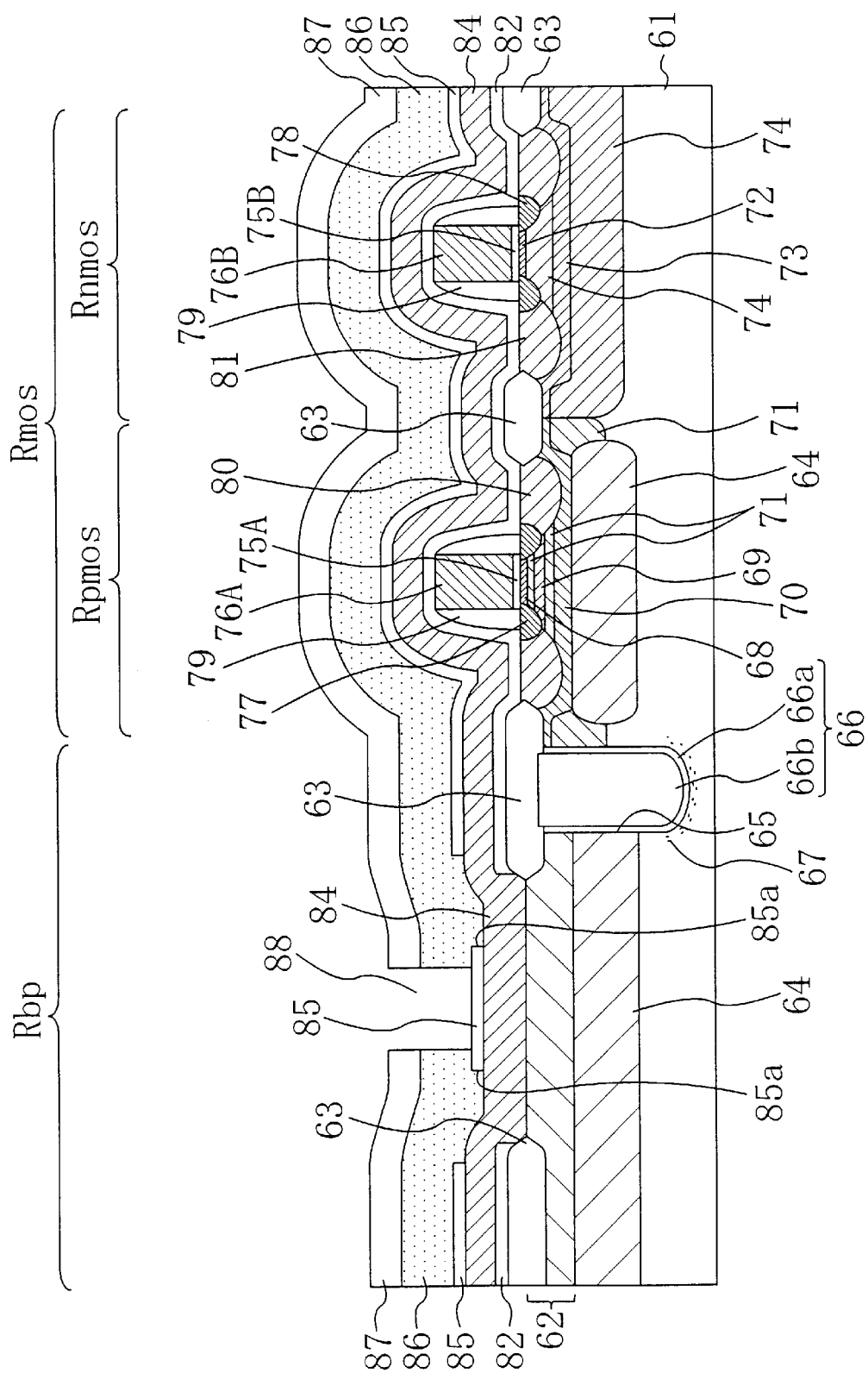
FIG. 8 is a cross-sectional view illustrating another state in the fabrication process for the BiCMOS device including an HBT having a base layer made of SiGe, where an emitter opening has just been formed.
Figure 9:
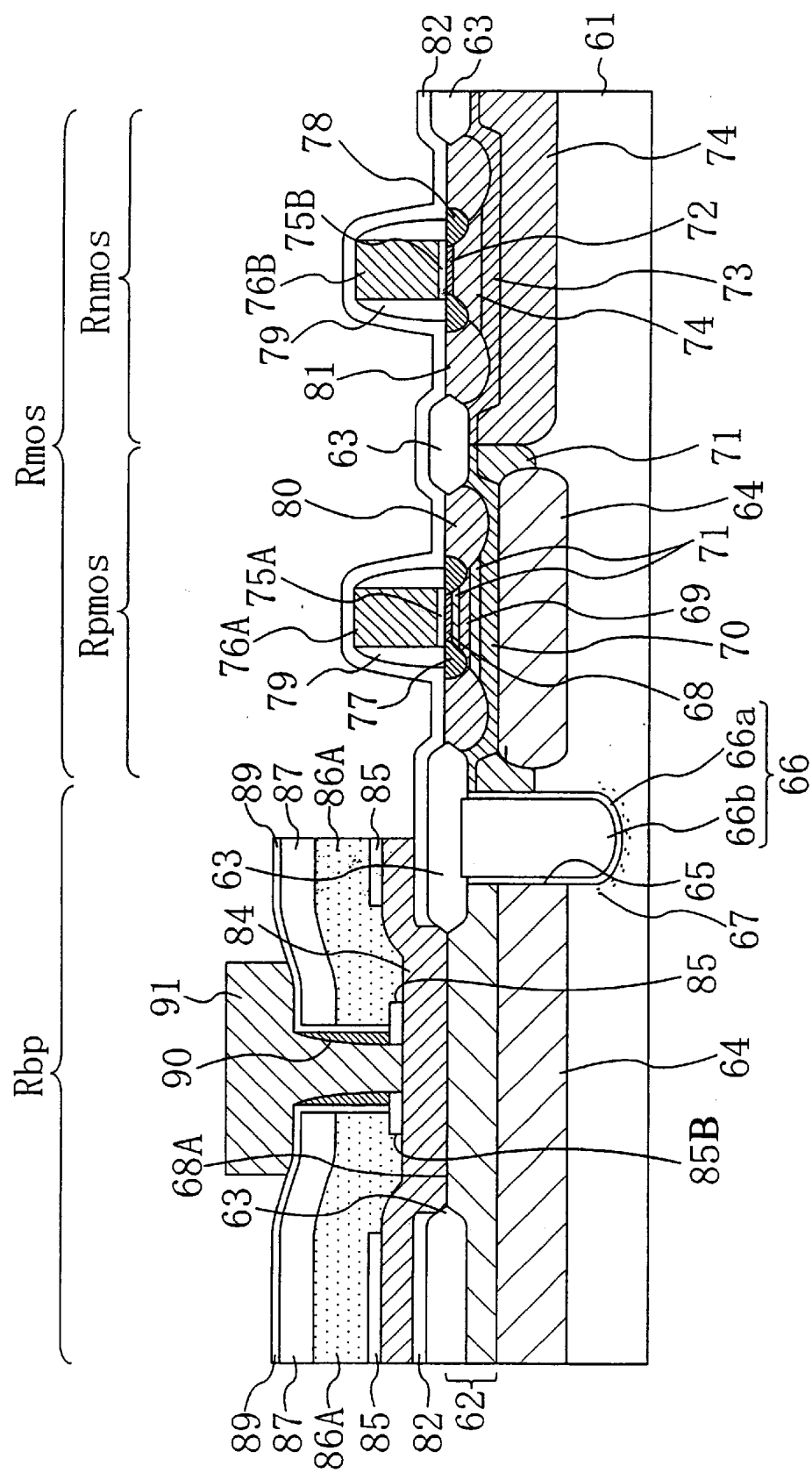
FIG. 9 is a cross-sectional view illustrating still another state in the fabrication process for the BiCMOS device including an HBT having a base layer made of SiGe, where an emitter electrode, an extrinsic base electrode, and the like have just been formed.

How the process for preventing cross-contamination is practically performed in the fabrication process for a BiCMOS device including a hetero bipolar transistor (HBT) and a normal CMOS device will be described. FIGS. 7 through 9 are cross-sectional views illustrating an example of the fabrication process for a BiCMOS including an HBT having a base layer made of SiGe.

In the step shown in FIG. 7, an n-type epitaxial layer 62 is formed over the entire surface of a p-type silicon substrate 61. Thereafter, an isolation oxide film 63 is formed on the n-type epitaxial layer 62 by a normal LOCOS method, to define a bipolar transistor formation region $R_{bp}$ and a MOS transistor formation region $R_{mos}$ on the p-type silicon substrate 61 and also define a PMOSFET formation region $R_{pmos}$ and an NMOSFET formation region $R_{nmos}$ in the MOS transistor formation region $R_{mos}$.

Although not shown, a protection oxide film is formed on the n-type epitaxial layer 62. An N-type buried layer 64 is formed in the bipolar transistor formation region $R_{bp}$ and the PMOSFET formation region $R_{pmos}$. A portion of the n-type epitaxial layer 62 in the bipolar transistor formation region $R_{bp}$ located above the n-type buried layer 64 constitutes a collector region 62A.

A trench 65 is formed below the portion of the isolation oxide film 63 surrounding the collector region 62A. A first polysilicon film 66b is filled in the trench 65 via a trench sidewall oxide film 66a therebetween, forming trench isolation 66 composed of the trench sidewall oxide film 66a and the first polysilicon film 66b. A first channel stopper layer 67 is formed in the vicinity of the bottom of the trench isolation 66.

Although not shown, an opening is formed through the isolation oxide film 63 when the trench 65 is formed, and after the formation of the trench isolation 66, cap oxidation is performed for the top of the trench isolation 66 to form a cap oxide film in the opening and thus integrate the cap oxide film with the isolation oxide film 63. Although not shown, a collector wall region and a collector electrode are formed on the side of the cap oxide film located at the left end as is viewed from FIG. 7.

In the PMOSFET formation region $R_{pmos}$, formed are a first threshold control layer 68, a punch through stopper layer 69, a second channel stopper layer 70, an n-type well layer 71, a first gate oxide film 75A, a first gate electrode 76A, first sidewalls 79, p-type lightly-doped source/drain layers 77, and p-type heavily-doped source/drain layers 80. In the NMOSFET formation region $R_{nmos}$, formed are a second threshold control layer 72, a third channel stopper layer 73, a p-type well layer 74, a second gate oxide film 75B, a second gate electrode 76B, first sidewalls 79, n-type lightly-doped source/drain layers 78, and n-type heavily-doped source/drain layers 81. Detailed description on respective steps for formation of these layers is omitted here.

Subsequently, a second TEOS film 82 is deposited on the entire surface of the resultant p-type silicon substrate 61. An opening is formed through the second TEOS film 82 in the bipolar transistor formation region $R_{bp}$ so as to expose the collector region 62A. A SiGe layer 84 that is to be a base region is then epitaxially grown so that the opening is completely filled with the SiGe layer. Since the second TEOS film 82 covers the entire surfaces of the NMOSFET and the PMOSFET, diffusion of Ge into the active regions of the NMOSFET and PMOSFET can be reliably prevented during the formation of the SiGe layer 84 on the second TEOS film 82.

In the step shown in FIG. 8, a third TEOS film 85 is deposited on the entire surface of the SiGe layer 84, and patterned to form base electrode contact windows 85a that allow portions of the SiGe layer 84 to be exposed and thus used as an extrinsic base electrode. Using the third TEOS film 85 as a mask, boron ions, for example, are implanted in the SiGe film 84 at an accelerating energy of 40 keV and a dose amount of $1.0 \times 10^{13}$ atoms/cm$^2$. If a treatment such as RTA is to be performed to immediately activate the implanted impurities, a line separate from the common line is used for RTA and the like.

The resultant p-type silicon substrate 61 is sequentially subjected to washing with sulfuric acid-hydrogen peroxide mixed water and boiling with a mixed solution of hydrogen peroxide water and ammonia water before it is put in a furnace. Dip etching is then performed to completely remove spontaneous oxide films (not shown) existing on the surface of the portions of the SiGe layer 84 exposed through the base electrode contact windows 85a. This enables reliable and easy removal of spontaneous oxide films.

Referring to FIG. 8, an amorphous silicon film 86 that is to be the extrinsic base electrode is grown on the entire surface of the third TEOS film 85 including the base electrode contact windows 85a at 530° C., for example, to completely fill the base electrode contact windows 85a. Subsequently, boron ions, for example, are implanted in the entire amorphous silicon film 86 at an accelerating energy of 8 keV and a dose amount of $3.0 \times 10^5$ atoms/cm$^2$.

A fourth TEOS film 87 is then deposited on the entire surface of the amorphous silicon film 86, and patterned together with the amorphous silicon film 86, to form an emitter electrode opening window 88 through the amorphous silicon film 86 and the fourth TEOS film 87.

Thereafter, a fifth TEOS film 89 is deposited on the entire surface of the fourth TEOS film 87 including the emitter electrode opening window 88 so as to cover the wall of the emitter electrode opening window 88. The fifth TEOS film 89 thus covers the side faces of the amorphous silicon film 86 exposed through the emitter electrode opening window 88. A third polysilicon film doped with n-type impurities is then deposited on the entire surface of the fifth TEOS film 89, and patterned by dry etching to form a second sidewall 90 made of the third polysilicon on the portion of the fifth TEOS film 89 covering the wall of the emitter electrode opening window 88. The portion of the third TEOS film 85 surrounded by the second sidewall 90 is then removed by wet etching, to thereby form an emitter electrode contact window 85b through the third TEOS film 85.

A fourth polysilicon film doped with n-type impurities is then deposited so that the emitter electrode contact window 85b and the emitter electrode opening window 88 are completely filled, and patterned to form an emitter electrode 91.

Thereafter, etching is sequentially performed for the fifth TEOS film 89, the fourth TEOS film 87, the amorphous silicon film 86, the third TEOS film 85, and the SiGe layer 84 by photolithography and dry etching, to form an extrinsic base electrode 86A made of the amorphous silicon film 86. The resultant p-type silicon substrate 61 is then subjected to rapid thermal annealing (RTA) at 950° C. for 15 seconds, for example, to activate the impurities implanted in the extrinsic base electrode 86A and the like. This RTA is performed in a separate line apart from the common line since the end face of the SiGe layer 84 is exposed. After the substrate is returned to the common line, performed are formation of an interlayer insulating film by low-temperature CVD, formation of contact hole, formation of interconnections, and the like by known methods. Control of this process corresponds to that shown in FIG. 3(c) except for the formation of a cap layer, which is omitted here. Alternatively, an oxide film sidewall or a nitride film sidewall serving as a cap layer may be formed on the side faces of the fifth TEOS film 89, the fourth TEOS film 87, the amorphous silicon film 86, the third TEOS film 85, and the SiGe layer 84 before execution of RTA, for preventing Ge scattering in the air. This corresponds to the process control shown in FIG. 3(b).

Alternatively, an oxide film sidewall or a nitride film sidewall serving as a cap layer may be formed on the side faces of the fifth TEOS film 89, the fourth TEOS film 87, the amorphous silicon film 86, the third TEOS film 85, and the SiGe layer 84 before execution of RTA in a separate line or the common line, for preventing Ge scattering in the air. Subsequently, the RTA may be performed on the common line. This corresponds to the process control shown in FIG. 3(a).

Alternatively, RTA may be performed in a separate line, and thereafter, an oxide film sidewall or a nitride film sidewall serving as a cap layer may be formed on the side faces of the fifth TEOS film 89, the fourth TEOS film 87, the amorphous silicon film 86, the third TEOS film 85, and the SiGe layer 84 in a separate line or the common line, for preventing Ge scattering in the air. Thereafter, the subsequent process can be performed on the common line. This corresponds to the process control shown in FIG. 3(c).

In the above examples, fabrication processes for devices including a SiGe layer were mainly described. Alternatively, the present invention is also applicable to the case of processing a wafer for devices including a SiGeC layer, a GeC layer, a Ge layer, or the like on a fabrication line and treating the devices at high temperature in the state where the SiGeC layer, the GeC layer, the Ge layer, or the like is substantially exposed. That is, by performing the process control as described above, cross-contamination due to intrusion of Ge into normal CMOS devices and the like can be prevented.

Naturally, the present invention is also applicable to the case of fabricating a semiconductor device from a purchased wafer in which a Ge-containing semiconductor layer such as a SiGe layer, a SiGeC layer, a GeC layer, and a Ge layer has already been formed.

INDUSTRIAL APPLICABILITY

The present invention is applicable to fabrication of HBT and HCMOS including a film containing Ge, in particular, among semiconductor devices incorporated in electronic equipment.

What is claimed is:

1. A method for fabricating a semiconductor device comprised of a Ge-containing semiconductor film using a common fabrication line for processing both a wafer comprised of a Ge-containing semiconductor film and a wafer comprised of a non-Ge-containing semiconductor film, the method comprising the steps of:

(a) exposing the Ge-containing semiconductor film;

(b) forming a cap layer on the Ge-containing semiconductor film having a function of blocking scattering of Ge from the Ge-containing semiconductor layer; and (c) heating the Ge-containing semiconductor film at a temperature of 700° C. or more after the step (b).

2. A method for fabricating a semiconductor device according to claim 1, wherein the step (b) is performed on a fabrication line separate from the common fabrication line, and the step (c) is performed on the common fabrication line.

3. A method for fabricating a semiconductor device according to claim 1, wherein the steps (b) and (c) are performed on the common fabrication line.

4. A method for fabricating a semiconductor device according to claim 1, wherein the steps (b) and (c) are performed on a fabrication line separate from the common fabrication line.

5. A method for fabricating a semiconductor device according to claim 1, further comprising the step of forming another cap layer on the existing cap layer.

6. A method for fabricating a semiconductor device according to any one of claims 1 to 5, wherein the Ge-containing semi-conductor film is made of at least one of SiGe, SiGeC, GeC, and Ge.

7. A method for fabricating a semiconductor device according to any one of claims 1 to 4, wherein the cap layer is made of at least one of silicon, silicon oxide, silicon nitride, and silicon oxynitride.

8. A method for fabricating a semiconductor device according to any one of claims 1 to 5, wherein the cap layer is made of silicon and is formed so that a thickness W(nm) and a heat treatment time t(min) satisfy the relationship: $W \geq 0.017t$ when the temperature of step (c) is in the range between 700 to 750° C.

9. A method for fabricating a semiconductor device according to any one of claims 1 to 5, wherein the cap layer is made of silicon and is formed so that a thickness W(nm) and a heat treatment time t(min) satisfy the relationship: $W \geq 0.046t$ when the temperature of step (c) is in the range between 700 to 820° C.

10. A method for fabricating a semiconductor device according to any one of claims 1 to 5, wherein the cap layer is made of silicon and is formed so that a thickness W(nm) and a heat treatment time t(min) satisfy the relationship: $W \geq 0.063t$ when the temperature of step (c) is 700 to 820° C.

11. A method for fabricating a semiconductor device comprised of a Ge-containing semiconductor film using a common fabrication line for processing both a wafer comprised of a Ge-containing semiconductor film and a wafer comprised of no Ge-containing semiconductor film, the method comprising the steps of:

(a) exposing the Ge-containing semiconductor film; and (b) processing the Ge-containing semiconductor film at a temperature of 700° C. or more on a fabrication line separate from the common fabrication line after the step (a).

12. A method for fabricating a semiconductor device according to claim 11, further comprising the steps of:

(c) forming a cap layer on the Ge-containing semiconductor film having a function of blocking scattering of Ge from the Ge-containing semiconductors film after the step (b).

13. A method for fabricating a semiconductor device according to claim 11 or 12, wherein the Ge-containing semiconductor film is made of at least one of SiGe, SiGeC, GeC and Ge.

14. A method for fabricating a semiconductor device according to claim 12, wherein the cap layer is made of at least one of silicon, silicon oxide, silicon nitride and silicon oxynitride.

* * * * *